United States Patent
Zhao et al.

(10) Patent No.: US 9,436,103 B2
(45) Date of Patent: Sep. 6, 2016

(54) WYNNE-DYSON PROJECTION LENS WITH REDUCED SUSCEPTIBILITY TO UV DAMAGE

(71) Applicant: Ultratech, Inc., San Jose, CA (US)

(72) Inventors: Peiqian Zhao, Mountain View, CA (US); Emily M. True, San Ramon, CA (US); Raymond Ellis, Aptos, CA (US); Andrew M. Hawryluk, Los Altos, CA (US)

(73) Assignee: Ultratech, Inc., San Jose, CA (US)

( * ) Notice: Subject to any disclaimer, the term of this patent is extended or adjusted under 35 U.S.C. 154(b) by 187 days.

(21) Appl. No.: 14/281,291

(22) Filed: May 19, 2014

(65) Prior Publication Data

US 2015/0331326 A1    Nov. 19, 2015

(51) Int. Cl.
G03F 7/20 (2006.01)
G02B 17/08 (2006.01)

(52) U.S. Cl.
CPC ....... G03F 7/70958 (2013.01); G02B 17/0892 (2013.01); G03F 7/7015 (2013.01); G03F 7/70225 (2013.01)

(58) Field of Classification Search
CPC . G02B 13/22; G02B 17/0892; G03F 7/7015; G03F 7/70225
See application file for complete search history.

(56) References Cited

U.S. PATENT DOCUMENTS

| | | | |
|---|---|---|---|
| 1,401,345 A | 12/1921 | Mechau | |
| 1,783,998 A | 12/1930 | Chretien | |
| 2,742,817 A | 4/1956 | Altman | |
| 4,171,871 A * | 10/1979 | Dill | G02B 17/008 359/730 |
| 4,391,494 A * | 7/1983 | Hershel | G03F 7/70225 355/43 |
| 5,559,629 A * | 9/1996 | Sheets | G02B 13/26 355/53 |
| 5,805,356 A | 9/1998 | Chiba | |
| 5,969,803 A | 10/1999 | Mercado | |
| 6,381,077 B1 * | 4/2002 | Jeong | G02B 17/008 355/53 |
| 6,813,098 B2 | 11/2004 | Mercado | |
| 6,863,403 B2 | 3/2005 | Mercado et al. | |
| 6,879,383 B2 | 4/2005 | Mercado | |
| 7,116,496 B1 | 10/2006 | Mercado | |
| 7,148,953 B2 | 12/2006 | Mercado | |

(Continued)

FOREIGN PATENT DOCUMENTS

CN    1877454        12/2006
EP    1959289 A1    8/2008

OTHER PUBLICATIONS

Braunecker, Bernhard Hentschel, Rudiger Tiziani, Hans J.. (2008). Advanced Optics Using Aspherical Elements. SPIE. Online version available at: http://app.knovel.com/hotlink/toc/id:kpAOUAE001/advanced-optics-using/advanced-optics-using.*

(Continued)

Primary Examiner — Steven H Whitesell Gordon
(74) Attorney, Agent, or Firm — Opticus IP Law PLLC

(57) ABSTRACT

A Wynne-Dyson projection lens for use in an ultraviolet optical lithography system is disclosed, wherein the projection lens is configured to have reduced susceptibility to damage from ultraviolet radiation. The projection lens utilizes lens elements that are made of optical glasses that are resistant to damage from ultraviolet radiation, but that also provide sufficient degrees of freedom to correct aberrations. The glass types used for the lens elements are selected from the group of optical glasses consisting of: fused silica, S-FPL51Y, S-FSL5Y, BSM51Y and BAL15Y.

13 Claims, 6 Drawing Sheets

(56) References Cited

U.S. PATENT DOCUMENTS

| | | |
|---|---|---|
| 7,177,099 B2 | 2/2007 | Mercado et al. |
| 7,573,655 B2 | 8/2009 | Schafer |
| 2004/0125352 A1* | 7/2004 | Mercado .............. G02B 17/008 355/67 |
| 2006/0092395 A1* | 5/2006 | Mercado .............. G02B 17/008 355/67 |
| 2006/0158615 A1* | 7/2006 | Williamson ......... G02B 17/008 353/37 |
| 2008/0117532 A1* | 5/2008 | Shafer ................. G03F 7/70225 359/727 |
| 2009/0185290 A1* | 7/2009 | Li ....................... G03F 7/70791 359/727 |
| 2013/0321935 A1* | 12/2013 | Stites ................. G03F 7/70225 359/728 |

OTHER PUBLICATIONS

J. Dyson, "Unit Magnification Optical System without Seidel Aberrations," *Journal of the Optical Society of America*, Jul. 1959.

Zhang Yudong et al., "A new family of 1:1 catadioptric broadband deep UV high NA lithography lenses," *SPIE* 1463 (1991): 688-694.

R.M.H. New et al., "Analytic optimization of Dyson optics," *Optical Society of America* 31 "Applied Optics," No. 10: 1444-1449.

Zhang et al., "Some Developments for a Unit Magnification Optical System," published by the Optical Society of America, *Applied Optics* 34, No. 7, Mar. 1, 1995.

Flores et al., "Lithographic performance of a new generation i-line optical system: A comparative analysis," *Proc. SPIE* 1927, Optical/Laser Microlithography, 899 (Aug. 8, 1993).

Information from www.Oharacorp.com regarding i-line glass types offered by Ohara Corporation of Japan.

Search Report from the Intellectual Property Office of Singapore (citing the Hungarian Intellectual Property Office) dated Oct. 20, 2015 for Singapore Patent Application No. 10201503346R, which is a counterpart to the above-identified US Patent Application.

Taiwan Office Action dated Jun. 23, 2016, for Patent Application No. 10520756720 , which is a counterpart to the above-identified US Patent Application.

\* cited by examiner

WYNNE-DYSON PROJECTION LENS WITH REDUCED SUSCEPTIBILITY TO UV DAMAGE

FIELD

The present disclosure relates to projection lenses, and in particular to Wynne-Dyson projection lenses used in photolithography performed at ultraviolet (UV) and deep UV (DUV) wavelengths, and more particularly to such projection lens that have reduced susceptibility to damage from UV radiation.

The entire disclosure of any publication or patent document mentioned herein is incorporated by reference, including the following references: J. Dyson, "Unit Magnification Optical System without Seidel Aberrations," *Journal of the Optical Society of America*, July 1959; U.S. Pat. No. 3,748, 015; U.S. Pat. No. 6,879,383; U.S. Pat. No. 7,166,496; U.S. Pat. No. 7,573,655; U.S. Pre-Grant Publication No. US2014/0049978; European Patent No. 0779558 A2; European Patent No. EP 206707 A2; and European Patent No. EP 0960074 A1.

BACKGROUND

Modern-day semiconductor manufacturing utilizes optical lithography projectors that image mask patterns onto semiconductor wafers as part of the process of making integrated circuits. The optical lithography projectors include illumination systems ("illuminators") that irradiate the mask with UV light because the smaller wavelength of UV light (as compared to visible light) allows for higher-resolution imaging. The optical lithography projectors utilize projection lenses (also called microlithographic lenses or optical lithography lenses), most of which include at least some glass lens elements. Because of the high demands placed on the imaging resolution over the image field, the projection lenses are designed for high performance.

A portion of the UV radiation (light) that passes through a given glass lens element interacts with the optical material. This includes light absorption whereby the absorbed light energy is converted to heat. The heat raises the local glass temperature, which changes the local index of refraction, thereby adversely changing the imaging performance of the projection lens. This effect is reversible, i.e., when the illumination terminates, the glass cools down and the imaging performance is restored. Thus, turning the illumination on (or off) gives rise to a thermal transient effect whereby the projection lens heats up (or cools down) until the temperature stabilizes. During this time, there is a thermally induced variation in imaging performance.

A second type of interaction between the UV light and the glass material changes the glass atomic structure and makes the structure denser, thereby locally increasing the glass refractive index and degrading the projection lens imaging performance. This effect is called "radiation compaction." It is not reversible, and the attendant refractive index increase is proportional to the irradiance of the exposure light as well as the time-accumulated irradiance of the exposure light.

A third type of interaction is called solarization, which also changes the glass atomic structure and reduces the glass transmission. Like radiation compaction, solarization is not reversible and is also proportional to the light irradiance within the glass and the time-accumulated irradiance.

Consequently, when a projection lens is exposed to high irradiance UV light over an extended period of time, compaction and solarization effects can permanently damage the glass elements and result in significantly degraded imaging performance. These adverse effects are becoming more problematic as increasingly greater amounts of UV radiation and increasing large imaging fields are being employed, which lead to greater irradiance levels traveling through the glass elements. Further, increasingly higher degrees of imaging performance limit the amount of performance degradation that is acceptable.

SUMMARY

An aspect of the disclosure is a Wynne-Dyson projection lens for use in an ultraviolet optical lithography system, wherein the projection lens is configured to have reduced susceptibility to damage from ultraviolet radiation is disclosed. The projection lens utilizes lens elements that are made of optical glasses that are resistant to damage from ultraviolet radiation, but that also provide sufficient degrees of freedom to correct aberrations. The glass types used for the lens elements are selected from the group of optical glasses consisting of: fused silica, S-FPL51Y, S-FSL5Y, BSM51Y and BAL15Y.

Another aspect of the disclosure is a Wynne-Dyson projection lens having object and image planes and an image field, and that has reduced susceptibility to damage from ultraviolet radiation. The lens includes along an optical axis: a concave mirror having a concave surface; a positive lens group spaced apart from the concave surface of the concave mirror; first and second prisms made of either fused silica or BSM51Y and disposed adjacent the positive lens group opposite the concave mirror and on respective sides of the optical axis, with the first and second prisms having respective surfaces that reside adjacent the object and image planes. The positive lens group consists of: a first lens group having a cemented doublet consisting of a plano-convex lens element made of either S-FPL51Y, S-FSL5Y or fused silica and having a planar surface in contact with the prisms, and a negative meniscus lens made of either BAL15Y or BSM51Y; and a second lens group spaced apart from the first lens group and consisting of either one or two lens elements each made of either S-FSL5Y, S-FPL51Y or fused silica. The projection lens has a numerical aperture NA in the range from 0.16 to 0.2, a substantially unit magnification, is substantially doubly telecentric and a Strehl ratio of >0.95 over the image field for a spectral bandwidth that includes ghi radiation.

Another aspect of the disclosure is an optical lithography system for imaging a reticle onto a wafer coated with photoresist. The system includes the Wynne-Dyson projection lens as described above, wherein the reticle resides at the object plane and the wafer resides at the image plane. The system also includes an illuminator arranged to operably illuminate the reticle with the ultraviolet radiation.

Another aspect of the disclosure is a Wynne-Dyson projection lens having object and image planes and an image field, and that has reduced susceptibility to damage from ultraviolet radiation. The lens includes along an optical axis: a concave mirror having a concave surface; a positive lens group spaced apart from the concave surface of the concave mirror; first and second prisms made of either fused silica or BSM51Y and disposed adjacent the positive lens group opposite the concave mirror and on respective sides of the optical axis, with the first and second prisms having respective surfaces that reside adjacent the object and image planes. The positive lens group includes: a first lens element L1 made of S-FPL51Y, S-FSL5Y or fused silica; a second lens element L2 made of BSM51Y or BAL15Y; and a third lens element L3 made of S-FPL51Y, S-FSL5Y or fused silica. The projection lens has: a numerical aperture NA in the range from 0.16 to 0.2; a substantially unit magnification; doubly telecentricity; and a Strehl ratio of >0.95 over the image field for a spectral bandwidth that includes ghi radiation.

Another aspect of the disclosure is a Wynne-Dyson projection lens having object and image planes and an image field, and that has reduced susceptibility to damage from ultraviolet radiation. The lens includes along an optical axis: a concave mirror having a concave surface; a positive lens group spaced apart from the concave surface of the concave mirror; first and second prisms made of either fused silica or BSM51Y and disposed adjacent the positive lens group opposite the concave mirror and on respective sides of the optical axis, with the first and second prisms having respective surfaces that reside adjacent the object and image planes; first and second lens elements that define a cemented doublet, wherein the first lens element has a planar surface in contact with the prisms and that is made of either S-FPL51Y or S-FSL5Y, and wherein the second lens element is made of either BAL15Y or BSM51Y; a third lens element spaced apart from the second lens element and made of either S-FSL5Y or S-FPL51Y. The projection lens has: a numerical aperture NA of 0.16; the image field is 40×20 mm; a substantially unit magnification; doubly telecentricity; and a Strehl ratio of >0.95 over the image field for a spectral bandwidth that includes ghi radiation.

Another aspect of the disclosure is the Wynne-Dyson projection lens as described above, wherein the positive lens group further includes a fourth lens element spaced apart from the third lens element towards the concave mirror and made of either S-FSL5Y or S-FPL51Y.

Another aspect of the disclosure is an optical lithography system for imaging a reticle onto a wafer coated with photoresist. The system includes the Wynne-Dyson projection lens as described above, wherein the reticle resides at the object plane and the wafer resides at the image plane, and an illuminator arranged to illuminate the reticle with the ultraviolet radiation.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which.

DETAILED DESCRIPTION

Figure 1:
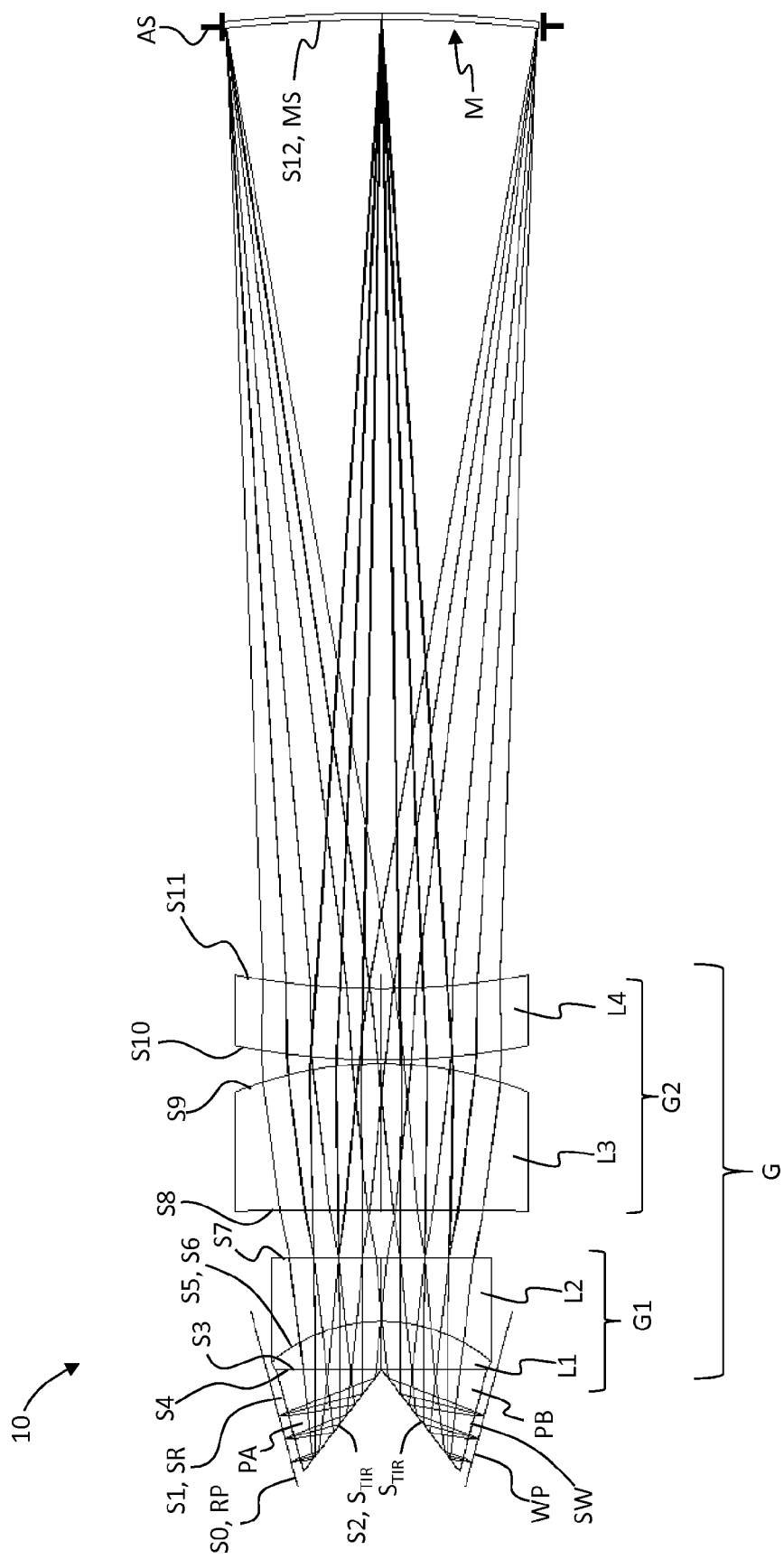
FIGS. 1 through 4 are optical diagrams of first, second third and fourth examples, respectively, of a Wynne-Dyson projection lens configured to have reduced susceptibility to UV damage according to the disclosure.

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation.

Reference is made below to the g, h and i lines of radiation, which nominally correspond to 365 nm, 405 nm, and 436 nm, respectively. UV light using these wavelengths is referred to below as "ghi light" or "ghi radiation," or just "ghi" for short. Optical lithography using these wavelengths is referred to as "ghi optical lithography." A projection lens designed for ghi optical lithography is referred to as a "ghi projection lens." In an example, the reduced susceptibility of the projection lens to UV radiation refers to ghi radiation.
Design Considerations Most of the standard optical glasses from the well-known commercial optical glass manufacturers are not suitable for high-quality projection lenses for semiconductor manufacturing because of their low transmission for ghi radiation, and especially for i-line radiation. Three optical glasses that have good transmission at ghi wavelengths and that have a low susceptibility to UV-induced damage are fused silica, S-FPL51Y and S-FSL5Y, which are available from Ohara Corporation, of Kanagawa, Japan.

For a Wynne-Dyson type unit magnification projection lens that operates over a relatively wide range of UV wavelengths such as the ghi wavelengths, chromatic aberrations need to be corrected. Because of the system's symmetry, lateral color is generally not a concern. On the other hand, axial color needs to be corrected, and this requires optical glass having a relatively high dispersion. However, the aforementioned S-FPL51Y, S-FSL5Y and fused silica optical glasses have relatively low dispersion. Thus, in example embodiments of the projection lenses disclosed herein, the optical glasses BSM51Y and BAL15Y from Ohara Corporation are utilized because they have the necessary dispersion to correct axial color while also having a relatively low susceptibility to UV-induced damage.

More specifically, the optical glasses S-FPL51Y, S-FSL5Y, fused silica, BSM51Y and BAL15Y have respective Abbe numbers of 81.14, 70.35, 67.82, 60.65, and 58.68. Thus, S-FPL51Y can serve as the low dispersion glass, fused silica and/or S-FSL5Y can serve as the medium dispersion glass, and BAL15Y and/or BSM51Y serve as the high dispersion glass. Using these glasses provides enough degrees of freedoms to adequately correct for the secondary spectrum as well as other aberrations over the ghi wavelengths.

Example Projection Lenses

Figure 2:
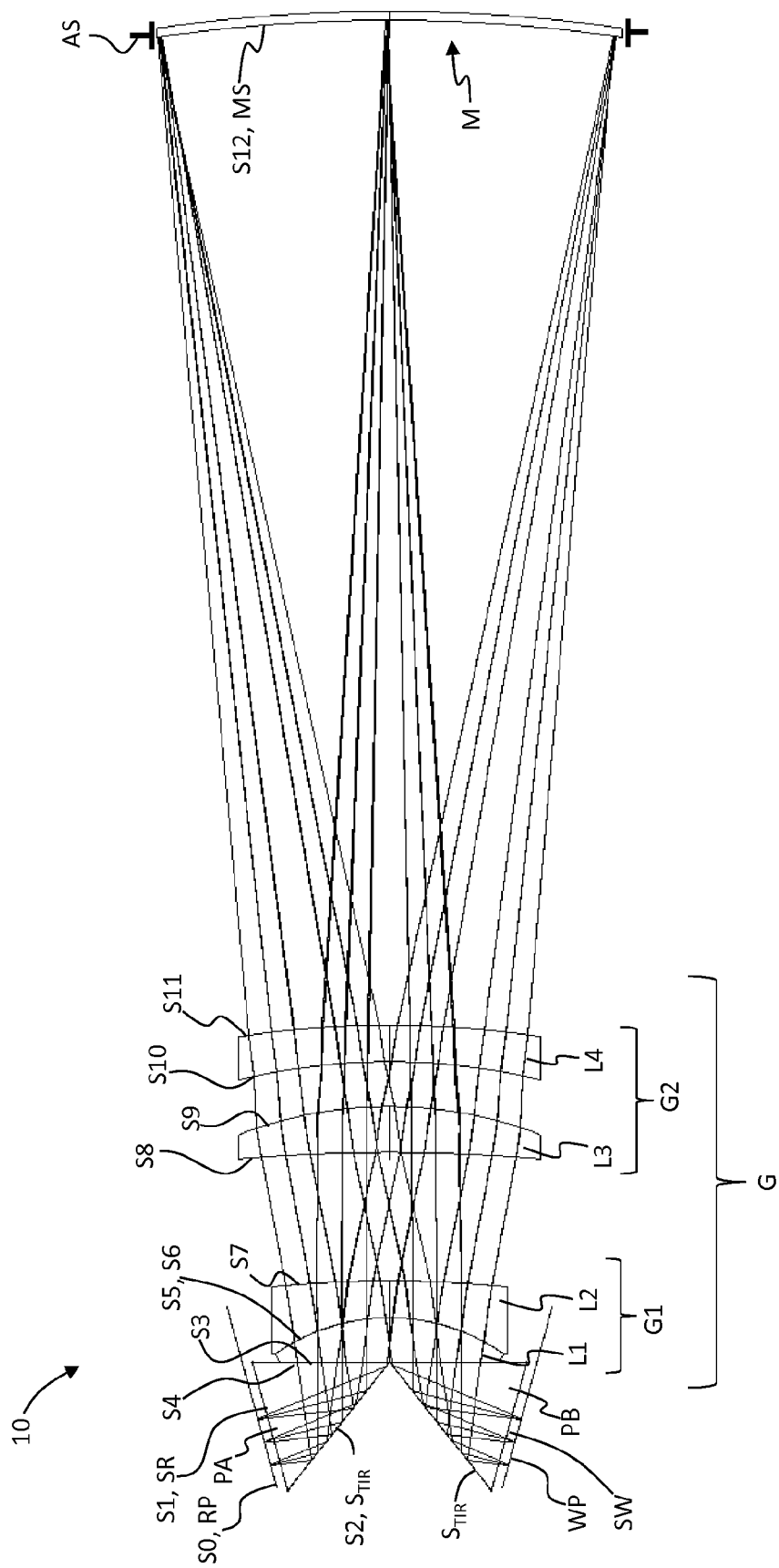
Figure 3:
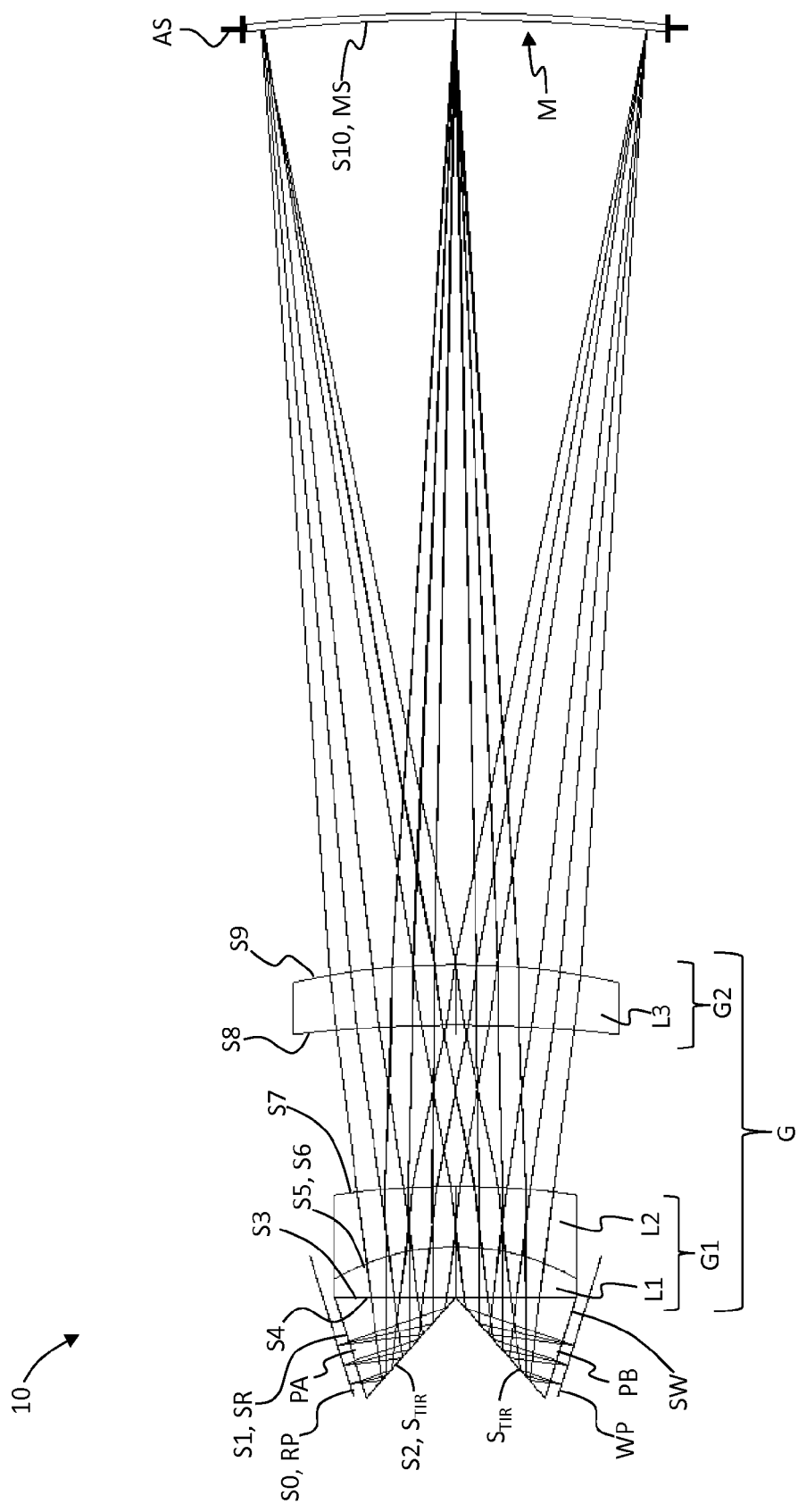

FIGS. 1 through 3 are optical system diagrams that respectively illustrate three different example embodiments of a Wynne-Dyson projection lens ("projection lens") 10. The projection lens 10 disclosed herein is substantially unit magnification, substantially doubly telecentric, and is designed for use with ghi radiation, i.e., it is well-corrected over a spectral bandwidth that includes ghi radiation.

Projection lens 10 includes an optical axis A1, a concave primary mirror M with a surface MS, and prisms PA and PB spaced apart from the primary mirror and arranged on opposite sides of the optical axis. In an example, prisms PA and PB are isosceles prisms. Prisms PA and PB have respective surfaces SR and SW that respectively reside adjacent a reticle plane RP and a wafer plane WP. Prisms PA and PB also each have surfaces $S_{TIR}$ that serve at total-internal reflection surfaces, thereby allowing for the reticle and wafer planes RP and WP to be spatially separated. Reticle plane RP resides at an object plane OP while wafer plane WP resides at an image plane IP.

Projection lens 10 includes a refractive lens group G with overall positive refractive power (i.e., a "positive" lens group) that resides between the primary mirror M and prisms PA and PB. The refractive lens group G can be divided into a first lens group G1 that includes a cemented doublet made up of a plano-convex lens element L1 and a (nominally) plano-concave lens element L2, and a second lens group G2 axially spaced apart from the first lens group and that includes either one lens element L3 or two lens elements L3 and L4. In an example, prisms PA and PB can be considered part of first lens group G1. Primary mirror M defines an aperture stop AS for projection lens 10.

Because projection lens 10 is symmetric about the stop aperture AS, the distortion and lateral color are generally well-corrected. Primary mirror M generates mainly astigmatism and field curvature without any color aberrations. So, the other refractive elements in projection lens 10 are designed to compensate for the two types of aberrations generated by the mirror, as well as aberrations that they would otherwise generate, such as spherical aberration and coma. Prisms PA and PB have no optical power, which allows for relatively loose mounting tolerances for these refractive elements.

In an example, even when projection lens 10 is substantially defocused (e.g., by +/−5 microns for Examples 1 and 3, and by +/−2.5 microns for Example 2), its imaging performance (e.g., as reflected by the Strehl ratio) remains substantially diffraction limited everywhere across the image field. The ability to maintain imaging performance over a relatively large range of focus positions is important characteristic since projection lens 10 is typically used to form images in photoresist, as described below in connection with optical lithography system 200 of FIG. 5.

For the example of projection lens 10 having three refractive lens elements L1 through L3, each lens can be made of the following optical glasses:
Lens element L1: S-FPL51Y, S-FSL5Y or fused silica;
Lens element L2: BSM51Y or BAL15Y; and
Lens element L3: S-FPL51Y, S-FSL5Y or fused silica.
For the example of projection lens 10 having the additional lens element L4, the first three lens elements can be made of the above optical glasses while the fourth lens element L4 can be made of S-FPL51Y, S-FSL5Y or fused silica.

Example 1

FIG. 1 is an optical diagram of Example 1 of projection lens 10. The projection lens 10 of Example 1 has a designed field radius of 50 mm, an usable field of view of 68 mm by 28 mm, a numerical aperture (NA) of 0.16, and an overall length of 800 mm. Prisms PA and PB are made of fused silica, while lens elements L1, L2, L3 and L4 are respectively made of S-FPL51Y, BAL15Y, S-FSL5Y and fused silica. The optical glasses BSM51Y and BAL15Y have very similar refractive indices at the ghi wavelengths (and hence have similar dispersion), and also have low susceptibility to UV-induced damage. Thus, the optical glass BAL15Y used in the design for lens element L2 can be replaced by optical glass BSM51Y with minor modification of the design while still obtaining similar image performance.

Table 1 below sets forth the optical prescription for Example 1, wherein "S" stands for the surface number, "TH" is the thickness, and "CA/2" is half of the clear aperture, i.e., or semi-diameter of the given element. Also, "r" stands for radius, k is the conic constant, and c represents the aspheric coefficients that describe an aspheric surface using the standard equation for an aspheric surface as is known in the art.

TABLE 1

EXAMPLE 1

| S | R (mm), k, c | TH (mm) | Material | CA/2 (mm) |
|---|---|---|---|---|
| S0 | r = infinity | 5.182 mm | | |
| S1 | r = infinity | 55.5 mm | Fused Silica | |
| S2 | r = infinity | 0 | | |
| S3 | r = infinity | 0 | | 56.45 mm |
| S4 | r = infinity | 26.372 mm | S-FPL51Y | 57.15 mm |
| S5 | r = −92.4315 | 0 | | 57.15 mm |
| S6 | r = −92.4315 | 35.011 mm | BAL15Y | 64.44 mm |
| S7 | r = infinity | 25.766 mm | | 69.87 mm |
| S8 | r = −6150 | 80.001 | S-FSL5Y | 79.28 |
| S9 | r = −212.6136 | 2.000 | | 79.75 |
| S10 | r = 410.827 | 38.989 | Fused Silica | |
| S11 | r = 428.8633 | 529.210 | | 77.80 |
| | k = −3.52295157 | | | |
| | $c_{4th}$ = 6.4527E-9 | | | |
| | $c_{6th}$ = −5.8530E-14 | | | |
| | $c_{8th}$ = 6.0603E-18 | | | |
| | $c_{10th}$ = −3.52E-22 | | | |
| S12 | r = −800 | | | 85.44 |

In Example, 1, the mirror-wise surface S11 of lens element L4 is aspheric and is the dominant contributor to compensating the astigmatism and field curvature from primary mirror M. Lens element L4 has a meniscus shape and has very little power. Most of the optical power of projection lens 10 is controlled by the primary mirror and lens element L2. The asphere lens element L4 is mainly used to control overall length and chief ray aberrations, in addition to higher-order aberrations. It should be noted that aspheric lens element L4 is not limited to having its aspheric surface S9 bend towards the primary mirror M. This surface could also bend away from the primary mirror.

Example 1 of projection lens 10 includes the following two design considerations. The first involves locating aspheric surface S9 as far away from the reticle and wafer planes RP and WP as possible. This is so that any high-frequency surface errors, which can occur during fabrication of the aspheric surface, have less effect on telecentricity and distortion. The second consideration is to avoid making the surface MS of primary mirror M an aspheric surface since any surface errors are multiplied by a factor of two due to the reflective nature of the mirror surface, and because testing of aspheric mirror surfaces tends to be more difficult and costly.

Example 2

FIG. 2 is an optical diagram of an Example 2 of the projection lens 10 as disclosed herein. The projection lens 10 of Example 2 has four lens elements L1 through L4 of the same glass type as in Example 1. The Example 2 design has a field radius of 50 mm, an usable field of view of 68 mm by 28 mm, a NA of 0.2, and an overall length of 805 mm. As in Example 1, surface S11 of lens element L4 is aspheric and is the dominant contributor to correcting astigmatism and field curvature introduced by primary mirror M. Lens element L4 has negative overall optical power, with its lens surfaces S8 and S9 bending away from primary mirror M. Lens element L4 has the same main function as in Example 1, namely to finely control the overall length and telecentricity.

In this Example 2 design, lens elements L3 and L4 are significantly thinner than those used in Example 1. This serves to reduce the amount of glass in the optical path, which reduces absorption and thus the aforementioned adverse thermal transient effects.

Table 1 below sets forth the optical prescription for Example 2.

TABLE 2

EXAMPLE 2

| S | r (mm), k, c | TH (mm) | Material | CA/2 (mm) |
|---|---|---|---|---|
| S0 | r = infinity | 5.182 | | |
| S1 | r = infinity | 70.000 | Fused Silica | |
| S2 | r = infinity | 0 | | |
| S3 | r = infinity | 0 | | |
| S4 | r = infinity | 24.185 | S-FPL51Y | 60.21 |
| S5 | r = −101.4781 | 0 | | 60.75 |
| S6 | r = −101.4781 | 20.000 | BAL15Y | 60.75 |
| S7 | r = −559.7193 | 70.003 | | 66.44 |
| S8 | r = −870.4049 | 25.000 | S-FSL5Y | 79.01 |
| S9 | r = −212.9743 | 24.381 | | 80.99 |
| S10 | r = −322.6115 | 20.000 | Fused Silica | 81.68 |
| S11 | r = 484.4477 | 546.254 | | 83.99 |
| | k = −1.59831712 | | | |
| | $c_{4th}$ = 7.9861E−10 | | | |
| | $c_{6th}$ = −2.1783E−14 | | | |
| | $c_{8th}$ = −5.757E−20 | | | |
| | $c_{10th}$ = 2.2703E−23 | | | |
| S12 | r = −813.1166 | | | 120.04 |

Example 3

FIG. 3 is an optical system diagram of Example 3 of projection lens 10 as disclosed herein. Example 3 of projection lens 10 has a design field radius of 36 mm and usable field of view of 40 mm by 20 mm, and an NA of 0.16. The overall length of projection lens 10 is 691 mm. As the field size is substantially smaller than Examples 1 and 2, the number of refractive lens elements is reduced by one relative to Examples 1 and 2. The prisms PA and PB are made of fused silica. Lenses L1, L2 and L3 are made from S-FPL51Y, BAL15Y and S-FSL5Y, respectively. Note that lens element L2 can also be made from BSM51Y. Lens element L3 has an aspheric surface S9, and surfaces S8 and S9 are configured to correct for astigmatism and field curvature introduced by primary mirror M.

Table 3 sets for the optical prescription for Example 3 of projection lens 10.

TABLE 3

EXAMPLE 3

| S | r (mm), k, c | TH (mm) | Material | CA/2 (mm) |
|---|---|---|---|---|
| S0 | r = infinity | 5.182 | | |
| S1 | r = infinity | 50.000 | Fused Silica | |
| S2 | r = infinity | 0 | | |
| S3 | r = infinity | 0 | | |
| S4 | r = infinity | 25.000 | S-FPL51Y | 42.38 |
| S5 | r = −92.1029 | 0 | | 43.87 |
| S6 | r = −92.1029 | 30.000 | BAL15Y | 43.87 |
| S7 | r = −311.7121 | 79.930 | | 48.49 |
| S8 | r = −519.4889 | 30.000 | S-FSL5Y | 56.96 |
| S11 | r = −274.7936 | 471.374 | | 59.80 |
| | k = 1.075090621 | | | |
| | $c_{4th}$ = 9.7906E−9 | | | |
| | $c_{6th}$ = 2.0779E−13 | | | |
| | $c_{8th}$ = 4.2347E−18 | | | |
| S12 | r = −697.211955 | | | 84.06 |

Example 4

Figure 4:
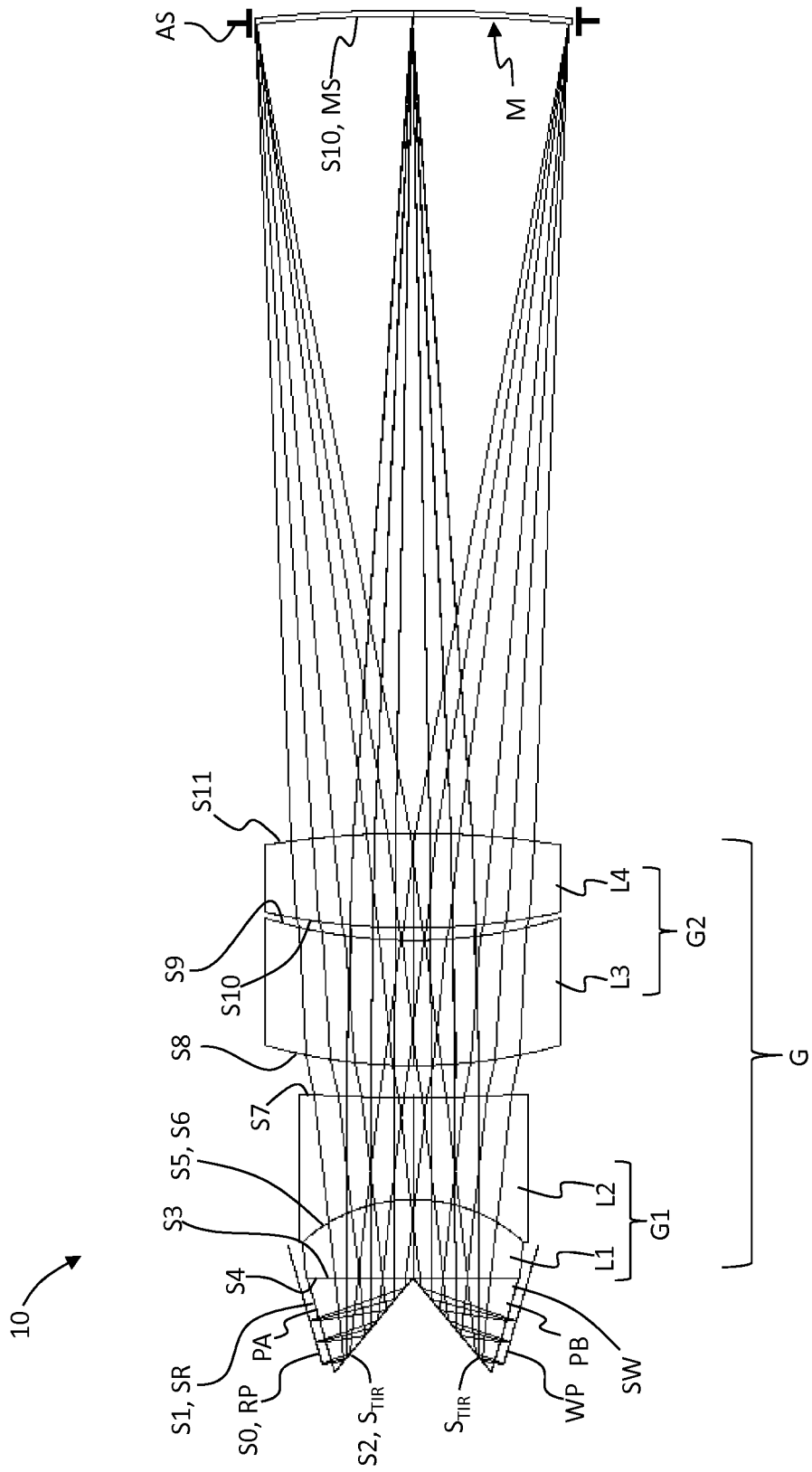

FIG. 4 is an optical system diagram of an Example 4 of projection lens 10 as disclosed herein. Example 4 of projection lens 10 has a design field radius of 50 mm, a usable field of view of 68 mm by 26 mm, and an NA of 0.16. Surface S11 is aspheric. Unlike the other examples, prisms PA and PB are made of BSM51Y, while lens element L1 is made of S-FPL51Y, lens elements L2 and L4 are made of S-FSL5Y and lens element L3 is made of fused silica. Thus, prisms PA and PB need not be only made of fused silica.

Table 4 below sets for the optical prescription for Example 3 of projection lens 10.

TABLE 4

EXAMPLE 4

| S | r (mm), k, c | TH (mm) | Material | CA/2 (mm) |
|---|---|---|---|---|
| S0 | r = infinity | 5.182 mm | | |
| S1 | r = infinity | 55.5 mm | BSM51Y | |
| S2 | r = infinity | 0 | | |
| S3 | r = infinity | 0 | | 56.45 mm |
| S4 | r = infinity | 46.003 mm | S-FPL5Y | 57.15 mm |
| S5 | r = −84.18704 mm | 0 | | 57.15 mm |
| S6 | r = −84.18704 mm | 60.001 mm | S-FSL5Y | 64.44 mm |
| S7 | r = 930.18835 | 18.711 mm | | 69.87 mm |
| S8 | r = 274.1023 mm | 73.661 mm | Fused Silica | 79.28 mm |
| S9 | r = 254.1152 mm | 7.377 mm | | 79.75 mm |
| S10 | r = 363.3433 mm | 55.539 mm | S-FSL5Y | |
| S11 | r = −452.3749 mm | 480.041 mm | | 77.80 mm |
| | k = 9.230303384 | | | |
| | $c_{4th}$ = 1.6900E−8 | | | |
| | $c_{6th}$ = 3.6121E−13 | | | |
| | $c_{8th}$ = 8.9935E−18 | | | |
| | $c_{10th}$ = 6.5388E−22 | | | |
| S12 | r = −800 mm | | | 86.00 mm |

Optical Lithography System

Figure 5:
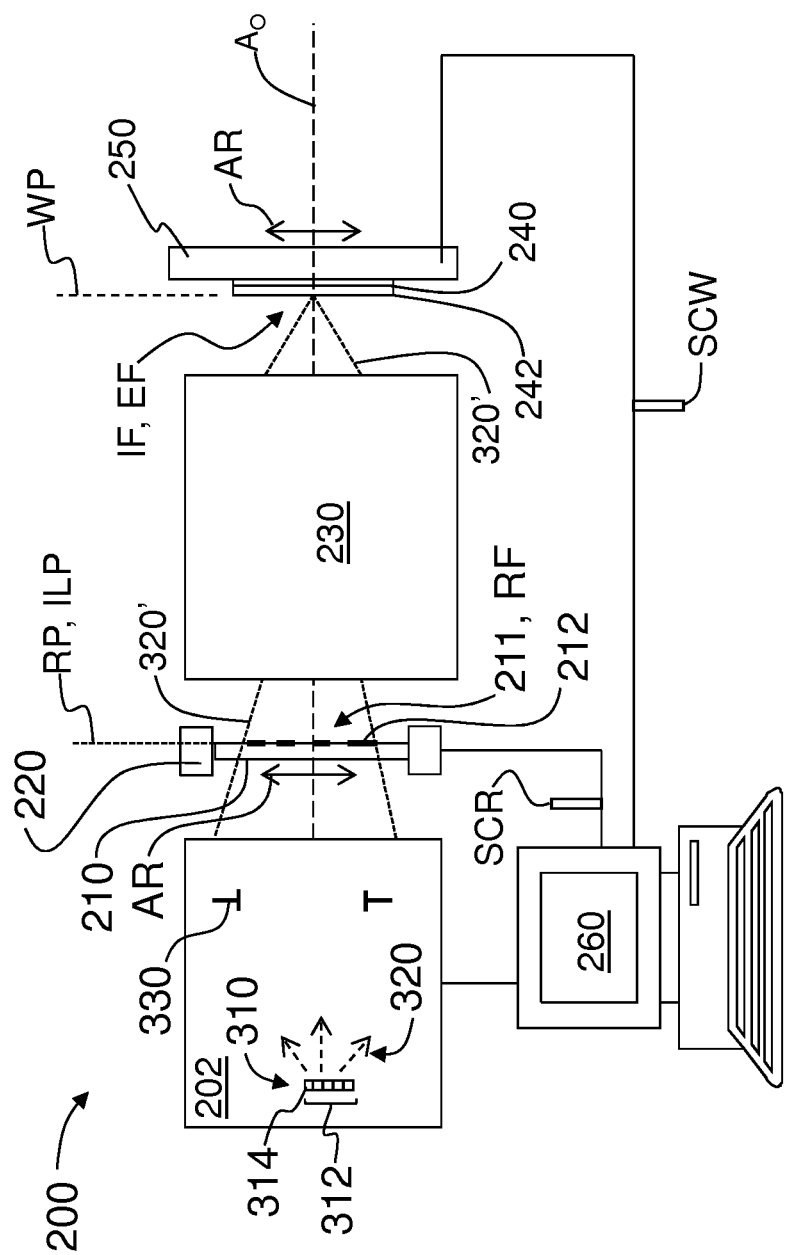
FIG. 5 is a schematic diagram of an example optical lithography system that employs the Wynn-Dyson projections lens having reduced susceptibility to UV damage as disclosed herein.

FIG. 5 is a schematic diagram of an example optical lithography system 200 that employs the projection lens 10 as disclosed herein. The optical lithography system 200 includes, in order along an optical axis A0, an illuminator 202, a reticle 210 (e.g., a patterned mask) supported by a reticle stage 220 at a reticle plane RP, a projection imaging lens 230, and a wafer 240 supported by a wafer stage 250 at a wafer plane WP. The reticle 210 includes a patterned region 211 that includes pattern elements 212 and that defines a reticle field RF. The wafer 240 includes an outer edge 241 (see FIG. 7). Note that the reticle and wafer planes RP and WP are shown parallel and on the same axis for ease of illustration. FIG. 1A shows the actual orientation of the reticle plane RP and wafer plane WP.

The wafer 240 includes a photosensitive coating 242 (e.g., photoresist) on the wafer surface that is activated by light (i.e., "actinic light") 320 generated by a light source 310 located in illuminator 210. The actinic light 320 comprises ghi radiation. Illuminator 202 is shown as included an aperture stop 330.

The optical lithography system 200 also includes a controller 260 operably connected to illuminator 210, reticle stage 220 and wafer stage 250. The controller 260 is configured to control the operation of optical lithography system 200. An example controller 260 includes a computer such as a personal computer or workstation. In an example, controller 260 includes apparatus-control software that includes instructions, embodied in a computer-readable medium, that control the various components of optical lithography system 200.

The illuminator 202 is configured to generate an illumination field ILF (see FIG. 5A) at object plane OP, which corresponds to reticle plane RP. The illumination field ILF includes uniformized actinic light 320' and illuminates at least a portion of reticle field RF over a reticle field exposure time so that projection lens 10 forms a corresponding image field IF at wafer plane WP over a corresponding wafer exposure time. The wafer stage 250 is movable (e.g., via a control signal SCW from controller 260) so that image field IF can be placed at different parts of wafer 240 to form various exposure fields EF on the wafer and in particular in photoresist 242. In an example, reticle stage 220 is movable via a control signal SCR from controller 260.

Figure 6B:
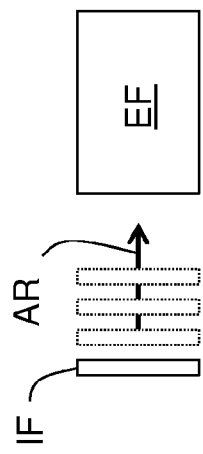
FIG. 6B is a schematic diagram of an example scanning illumination field and an example exposure field associated with the scanned illumination field.
Figure 6A:
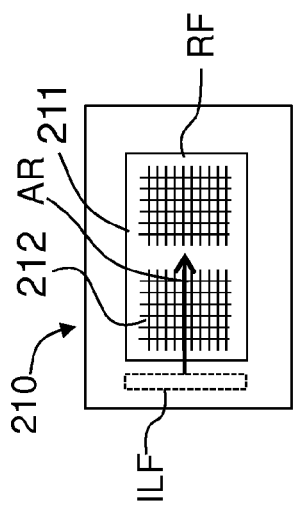
FIG. 6A is a schematic front-on view of an example reticle showing the reticle pattern that defines the reticle field and also showing an example of a scanned illumination field.

Thus, uniformized actinic light 320' from illuminator 202 is used to illuminate at least a portion of patterned region 211 that defines reticle field RF. The illuminated portion of reticle field RF is then imaged onto photosensitive coating 242 of wafer 240 via projection imaging lens 230. In an example embodiment, reticle 210 and wafer 240 are moved together in a manner that scans image field IF over the wafer as illumination field ILF scans over reticle field RF, as illustrated by arrows AR in FIG. 1 and also as schematically illustrated in FIGS. 6A and 6B. This operation forms a scanned exposure field EF that is larger than either illumination field ILF or image field IF. This process is then repeated for a different (unexposed) region of wafer 240. This printing approach is referred to in the art as "step and scan."

Figure 6D:
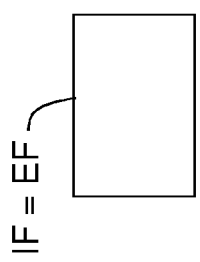
FIG. 6D is similar to FIG. 6B and illustrates an example of a full-field image field that corresponds in size to the corresponding exposure field.
Figure 6C:
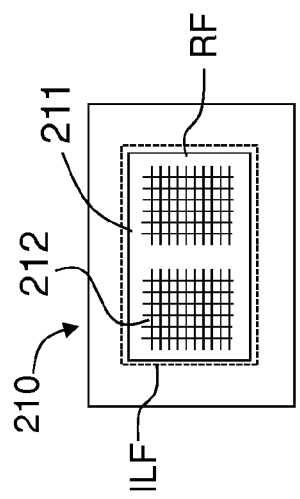
FIG. 6C is similar to FIG. 6A and illustrates an example of a full-field illumination field.

In another example, illumination field ILF illuminates the entire reticle field RF at once, thereby forming, in a single exposure, one exposure field EF. The wafer 240 is then moved, and the single static exposure is repeated. This printing approach is called "step and repeat." FIG. 6C is similar to FIG. 5A and illustrates an example of a full-field illumination field ILF used for step-and-repeat printing. FIG. 6D is similar to FIG. 6B and illustrates an example of a full-field image field IF that corresponds in size to the corresponding exposure field EF as used in step-and-repeat printing.

Figure 7:
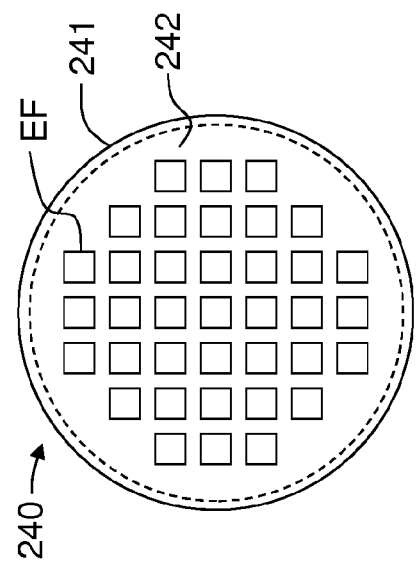
FIG. 7 is a plan view of a semiconductor wafer with exposure fields formed thereon by the photolithography system of FIG. 5.

With reference to FIG. 7, exposure fields EF formed on wafer 240 in photoresist 242 are in turn used to form integrated circuit chips via standard photolithographic and semiconductor processing techniques.

It is estimated that lower susceptibility to UV-induced damage for the projection lens 10 as disclosed herein should allow the projection lens to last 7 to 10 times longer than a conventional projection lens used in the same optical lithography system under the same operating conditions.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A Wynne-Dyson projection lens having object and image planes and an image field, and that has reduced susceptibility to compaction from ultraviolet radiation, the lens comprising along an optical axis:
   a concave mirror having a concave surface;
   a positive lens group spaced apart from the concave surface of the concave mirror;
   first and second prisms made of either fused silica or BSM51Y and disposed adjacent the positive lens group opposite the concave mirror and on respective sides of the optical axis, with the first and second prisms having respective surfaces that reside adjacent the object and image planes;
   wherein the positive lens group consists of:
      a first lens group having a cemented doublet consisting of a plano-convex lens element made of either S-FPL51Y, S-FSL5Y or fused silica and having a planar surface in contact with the prisms, and a negative meniscus lens made of either BAL15Y or BSM51Y; and
      a second lens group spaced apart from the first lens group and consisting of either one or two lens elements each made of either S-FSL5Y, S-FPL51Y or fused silica; and
   wherein the projection lens has a numerical aperture NA in the range from 0.16 to 0.2, a substantially unit magnification, is substantially doubly telecentric and a Strehl ratio of >0.95 over the image field for a spectral bandwidth that includes ghi radiation.

2. The Wynne-Dyson projection lens of claim 1, wherein the image field is 40 mm×20 mm, and wherein the second lens group consists of the one lens element made of S-FSL5Y.

3. The Wynne-Dyson projection lens of claim 1, wherein the image field is 68 mm×28 mm, wherein the NA=0.16, and wherein the second lens group consists of the two spaced-apart lens elements.

4. The Wynn-Dyson projection lens of claim 3, wherein the most mirror-wise lens element of the second lens group has a most mirror-wise concave surface.

5. The Wynn-Dyson projection lens of claim 3, wherein the most mirror-wise lens element of the second lens group has a most mirror-wise convex surface.

6. The Wynn-Dyson projection lens of claim 1, wherein the first and second prisms are each isosceles prisms.

7. An optical lithography system for imaging a reticle onto a wafer coated with photoresist, comprising:

the Wynne-Dyson projection lens of claim 1, wherein the reticle resides at the object plane and the wafer resides at the image plane; and an illuminator arranged to operably illuminate the reticle with the ultraviolet radiation.

8. A Wynne-Dyson projection lens having object and image planes and an image field, and that has reduced susceptibility to compaction from ultraviolet radiation, the lens comprising along an optical axis:

a concave mirror having a concave surface;

a positive lens group spaced apart from the concave surface of the concave mirror;

first and second prisms made of either fused silica or BSM51Y and disposed adjacent the positive lens group opposite the concave mirror and on respective sides of the optical axis, with the first and second prisms having respective surfaces that reside adjacent the object and image planes;

wherein the positive lens group includes: a first lens element L1 made of S-FPL51Y, S-FSL5Y or fused silica; a second lens element L2 made of BSM51Y or BAL15Y; and a third lens element L3 made of S-FPL51Y, S-FSL5Y or fused silica; and wherein the projection lens has: a numerical aperture NA in the range from 0.16 to 0.2; a substantially unit magnification; doubly telecentricity; and a Strehl ratio of >0.95 over the image field for a spectral bandwidth that includes ghi radiation.

9. The Wynne-Dyson projection lens of claim 8, wherein the positive lens group further includes a fourth lens element L4 made of S-FPL51Y, S-FSL5Y or fused silica.

10. The Wynne-Dyson projection lens of claim 9, wherein the first and second lens elements define a cemented doublet, with the first lens element being plano-convex and contacting the first and second prisms.

11. An optical lithography system for imaging a reticle onto a wafer coated with photoresist, comprising:

the Wynne-Dyson projection lens of claim 8, wherein the reticle resides at the object plane and the wafer resides at the image plane; and an illuminator arranged to illuminate the reticle with the ultraviolet radiation.

12. A Wynne-Dyson projection lens having object and image planes and an image field, and that has reduced susceptibility to compaction from ultraviolet radiation, the lens comprising along an optical axis:

a concave mirror having a concave surface;

a positive lens group spaced apart from the concave surface of the concave mirror;

first and second prisms made of either fused silica or BSM51Y and disposed adjacent the positive lens group opposite the concave mirror and on respective sides of the optical axis, with the first and second prisms having respective surfaces that reside adjacent the object and image planes;

first and second lens elements that define a cemented doublet, wherein the first lens element has a planar surface in contact with the prisms and that is made of either S-FPL51Y or S-FSL5Y, and wherein the second lens element is made of either BAL15Y or BSM51Y;

a third lens element spaced apart from the second lens element and made of either S-FSL5Y or S-FPL51Y; and wherein the projection lens has: a numerical aperture NA of 0.16; the image field is 40×20 mm; a substantially unit magnification; doubly telecentricity; and a Strehl ratio of >0.95 over the image field for a spectral bandwidth that includes ghi radiation.

13. An optical lithography system for imaging a reticle onto a wafer coated with photoresist, comprising:

the Wynne-Dyson projection lens of claim 12, wherein the reticle resides at the object plane and the wafer resides at the image plane; and an illuminator arranged to illuminate the reticle with the ultraviolet radiation.

* * * * *